US009502522B1

(12) United States Patent
Wang et al.

(10) Patent No.: US 9,502,522 B1
(45) Date of Patent: Nov. 22, 2016

(54) MASS PRODUCTION PROCESS OF HIGH VOLTAGE AND HIGH CURRENT SCHOTTKY DIODE WITH DIFFUSED DESIGN

(71) Applicant: Chongqing Pingwei Enterprise Co., Ltd., Chongqing (CN)

(72) Inventors: Xinglong Wang, Chongqing (CN); Shuzhou Li, Chongqing (CN); Li Zhang, Chongqing (CN); Xiangtao Xu, Chongqing (CN)

(73) Assignee: Chongqing Pingwei Enterprise Co., Ltd., Chongqing (CN)

( * ) Notice: Subject to any disclaimer, the term of this patent is extended or adjusted under 35 U.S.C. 154(b) by 0 days.

(21) Appl. No.: 15/056,673

(22) Filed: Feb. 29, 2016

(51) Int. Cl.
*H01L 29/872* (2006.01)
*H01L 29/66* (2006.01)
*H01L 21/304* (2006.01)
*H01L 29/47* (2006.01)
*H01L 21/225* (2006.01)
*H01L 21/78* (2006.01)
*H01L 21/306* (2006.01)
*H01L 21/265* (2006.01)
*H01L 21/285* (2006.01)
*H01L 21/66* (2006.01)
(Continued)

(52) U.S. Cl.
CPC ..... *H01L 29/66143* (2013.01); *H01L 21/2251* (2013.01); *H01L 21/26513* (2013.01); *H01L 21/2855* (2013.01); *H01L 21/302* (2013.01); *H01L 21/304* (2013.01); *H01L 21/30604* (2013.01); *H01L 21/30625* (2013.01); *H01L 21/78* (2013.01); *H01L 22/12* (2013.01); *H01L 22/14* (2013.01); *H01L 22/20* (2013.01); *H01L 29/47* (2013.01); *H01L 29/861* (2013.01); *H01L 29/8611* (2013.01); *H01L 29/872* (2013.01)

(58) Field of Classification Search
CPC ........... H01L 29/861–29/8611; H01L 29/872; H01L 29/47; H01L 29/66143; H01L 2924/12032; H01L 21/0495; H01L 21/2251–21/2257; H01L 21/26506–21/2652; H01L 21/2855; H01L 21/30625; H01L 21/78; H01L 21/782–21/784; H01L 21/302–21/304; H01L 21/461
See application file for complete search history.

(56) References Cited

U.S. PATENT DOCUMENTS 5,362,683 A * 11/1994 Takenaka ............... H01L 21/304
117/54
5,641,362 A * 6/1997 Meier ................. H01L 31/02244
136/255
(Continued)

*Primary Examiner* — Marvin Payen
*Assistant Examiner* — Jeremy Joy
(74) *Attorney, Agent, or Firm* — Novoclaims Patent Services LLC; Mei Lin Wong

(57) ABSTRACT

A process of manufacture of high voltage (300-600V) and high current (10-100 A) Schottky diode, which includes the following steps in sequence: provide a N-type silicon wafer; process phosphor deposition and high-concentration N+ phosphorus diffusion; cutting and chemical mechanical polishing; classifying into different voltage groups; processing primary oxidation and lithography; processing boron diffusion, secondary lithography and wiring; process ion implantation and metal spluttering to form the Schottky barrier; process metal evaporation and lithography for front metal; and finally process etching and metal evaporation for rear metal. Instead of the conventional epitaxial process, a diffusion process is employed to form the N+ layer. The final product is equipped with the advantages of Schottky diode and is applicable for high voltage of 300-600V and high current of 10-100 A. The current leakage and defect rate are dramatically lowered while the cost is lowered, thus mass production is facilitated.

20 Claims, 8 Drawing Sheets

(51) Int. Cl.
*H01L 29/861* (2006.01)
*H01L 21/302* (2006.01)

(56) References Cited

U.S. PATENT DOCUMENTS

| | | | | |
|---|---|---|---|---|
| 5,653,803 A * | 8/1997 | Ito | ............... | H01L 21/304 117/101 |
| 6,274,892 B1 * | 8/2001 | Kub | ............... | H01L 21/187 257/131 |
| 9,196,503 B2 * | 11/2015 | Yang | ............... | H01L 21/46 |
| 2006/0255423 A1 * | 11/2006 | Ryu | ............... | H01L 29/872 257/485 |
| 2008/0277668 A1 * | 11/2008 | Okuno | ............ | H01L 29/0692 257/77 |
| 2009/0160008 A1 * | 6/2009 | Fujiwara | ......... | H01L 29/872 257/471 |
| 2010/0032730 A1 * | 2/2010 | Endo | ............... | H01L 29/456 257/280 |
| 2014/0264477 A1 * | 9/2014 | Bhalla | ............ | H01L 29/41766 257/263 |
| 2015/0206941 A1 * | 7/2015 | Uehigashi | ....... | H01L 29/872 257/77 |

* cited by examiner

MASS PRODUCTION PROCESS OF HIGH VOLTAGE AND HIGH CURRENT SCHOTTKY DIODE WITH DIFFUSED DESIGN

BACKGROUND OF THE PRESENT INVENTION

1. Field of Invention

The present invention relates to a production process of silicon chips, and more particularly to a JBS (Junction Barrier Schottky) diode production process, which belongs to the field of manufacture of high voltage (300-600V) and high current (10-100 A) Schottky diode.

2. Description of Related Arts

Schottky components belongs to surface semiconductor components and its maximum voltage is 200V. When Schottky barrier components are integrated with traditional p/n junction diodes, its reverse breakdown voltage (vbr) can be increased to above 300V. Since the advantages of Schottky barrier in forward conduction can be utilized, the forward voltage drop of 0.75V is made possible. For silicon semiconductor, which is suitable for manufacture of 300-600V high current (10-100 A) components, Schottky components have unique technical advantages to replace the existing Fast Recovery Diode (FRD). All of the existing literatures reported that JBS diode is manufactured by epitaxial process. However, the existing epitaxial process has the disadvantages of high cost and high rate of defect.

SUMMARY OF THE PRESENT INVENTION

An object of the present invention is to solve the above problems by providing a production process of high voltage and high current Schottky diode with diffused design. In particular, the production process can manufacture Schottky diode with diffused design for silicon semiconductor with a voltage range of 300-600V and a current range of 10-100 A applicability.

Accordingly, in order to accomplish the above objectives, the present invention provides the following technological solution:

A production process of high voltage and high current Schottky diode with diffused design, comprising the following steps in sequence:

(a) selecting a raw N-type silicon wafer;

(b) processing phosphor deposition for a surface of the raw N-type silicon wafer to form a high-concentration phosphorus layer on the surface;

(c) processing high-concentration N+ phosphorus diffusion;

(d) processing silicon wafer singulation: obtain two equal silicon units by wire cutting with wire diameter at 30±5 μm;

(e) processing chemical mechanical polishing (CMP): removing a surface of 30±5 μm to obtain a polished silicon unit of 205±5 μm;

(f) processing classification of polished silicon units into different voltage groups based on a relationship between voltage v, resistivity p and thickness t;

The purpose of classification is based on the relationship between resistivity, thickness and voltage to classify the polished silicon units for different voltage range applicability;

For $\rho$=6-7.9: (thickness 200-204 μm) 300-350V; (thickness 205-210 μm) 351-400V;

For $\rho$=8-9.9: (thickness 200-204 μm) 401-450V; (thickness 205-210 μm) 451-500V;

For $\rho$=10-12: (thickness 200-204 μm) 501-550V; (thickness 205-210 μm) 551-600V;

(g) Processing primary oxidation;

(h) Processing primary lithography;

(i) Processing boron diffusion to form a p-type diffusion layer with a thickness of 6±1 μm;

(j) Processing secondary lithography; lithography of wiring hole in the central region for the JBS;

(k) processing ion implantation to form p+ layer (4~5× $10^{19}$ mM)

(l) processing metal splutting;

(m) forming Schottky barrier (n) processing metal evaporation for front contact side through (i) Titanium (Ti), Nickel (Ni) and Silver (Ag) or (ii) Titanium (Ti), Nickel (Ni) and Aluminum (Al), the selection of (i) Titanium (Ti), Nickel (Ni) and Silver (Ag) or (ii) Titanium (Ti), Nickel (Ni) and Aluminum (Al) is based on the welding mode and the aluminum wire wiring method in encapsulation process;

(o) processing lithography for front metal;

(p) processing rear contact side treatment: removing residual oxide layer or harmful substances by etching solution; and (q) processing metal evaporation for rear contact side to obtain the final product.

According to the process of the present invention, instead of the conventional epitaxial process, a diffusion process is employed to form the N+ layer.

Preferably, in the step (b), the process is carried out inside a diffusion furnace. The silicon wafer 10 is placed under a temperature of 1150-50° C., protected under nitrogen gas environment and the process time is 120±10 minutes, a liquid phosphorus pentoxide is carried by 5% oxygen gas (by volume ratio) and the phosphorus pentoxide breaks down to provide the high-concentration phosphor layer.

Preferably, in the step (a), the raw silicon wafer 10 has a resistivity $\rho$=6-12 Ω·cm; and a thickness t of 500±50 μm.

Preferably, in the step (c), the process parameters of the diffusion furnace are as follows: temperature: 1275±50° C., process time: 175±5 hours, protective gas environment: 90% nitrogen gas and 10% oxygen gas (by volume ratio).

Preferably, in the step (g), the process parameters are as follows: oxidation temperature: 1100-50° C., process time: 110±10 minutes, atmospheric environment: $N_2$+($H_2$+$O_2$)+$O_2$.

Preferably, in the step (l), Ni/Pt15-30% alloy or Ti is used.

Preferably, in the step (m), in the Alloy furnace, temperature: 480-510° C., atmospheric environment: $N_2$+15% $H_2$ (by volume ratio).

Preferably, in the step (p), the etching solution has a composition of $HNO_3$, HF, HAC and $H_2O$, where $HNO_3$:HF:HAC:$H_2O$=1:1:1:20~25.

The advantageous effect of the process of the present invention includes the followings: The process of manufacturing JBS Schottky diode in diffused design of the present invention is particular suitable for high current chip technology, where the cost is at least lowered by one third when compared to epitaxial process. Also, when the JBS Schottky diode in diffused design of the present invention is compared with the conventional diode manufactured by epitaxial process, the current leakage under 125° C. is lowered by 30% or more and the defect rate is significantly lower. In addition, the process is comparatively simple and can facilitate mass production.

DETAILED DESCRIPTION OF THE PREFERRED EMBODIMENT

The present invention is further described in details with the accompanying drawings and embodiments.

Figure 15:
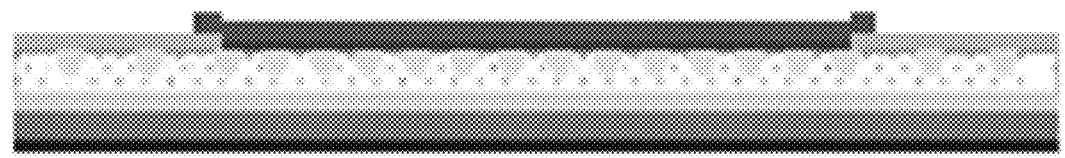
FIG. 15 is a schematic structural illustration of a silicon unit after processing metal evaporation of rear side of a production process of high voltage and high current Schottky diode with diffused design according to the preferred embodiment of the present invention.
Figure 16:
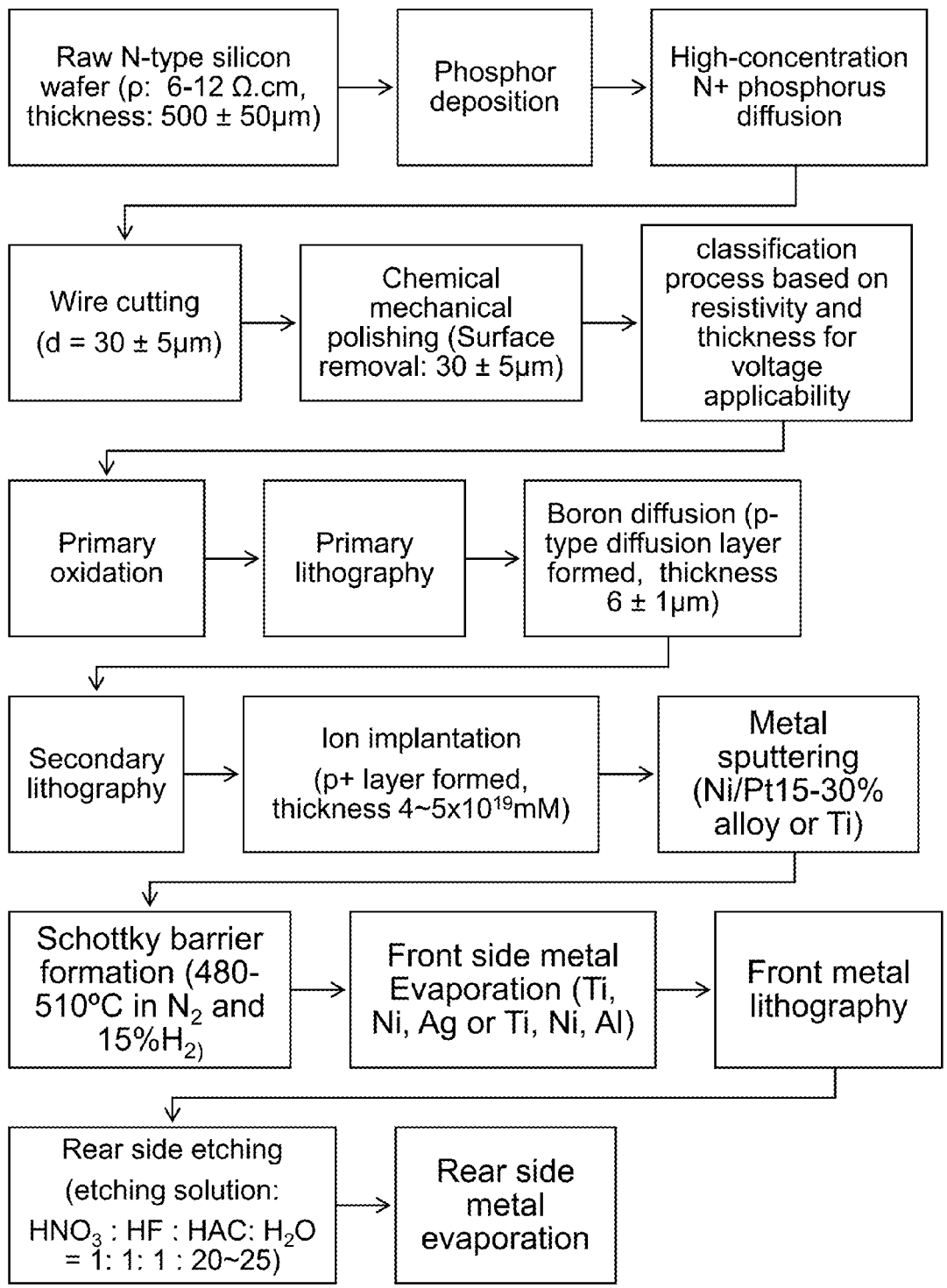
FIG. 16 is a flow chart showing the production process of high voltage and high current Schottky diode with diffused design according to the preferred embodiment of the present invention.

FIGS. 1-15 refers to an illustration of the step by step manufacturing process according to the process of manufacturing high voltage and high current Schottky diode with diffused design according to the preferred embodiment of the present invention. FIG. 16 is a flow chart showing the process of manufacturing high voltage and high current Schottky diode with diffused design according to the preferred embodiment of the present invention.

Figure 1:
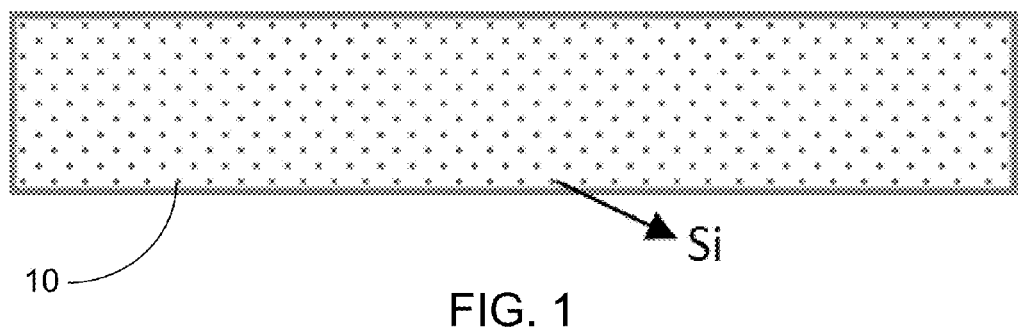
FIG. 1 is a schematic structural illustration of a raw silicon wafer in a production process of high voltage and high current Schottky diode with diffused design according to the preferred embodiment of the present invention.

Referring to FIGS. 1-16 of the drawings, a process of manufacturing JBS Schottky diode according to a preferred embodiment of the present invention comprises the following steps:

(a) Select a raw N-type silicon wafer 10. Preferably, as shown in FIG. 1, the raw silicon wafer 10 has a resistivity $\rho$=6-12 $\Omega \cdot$cm; and a thickness t of 500±50 μm.

Figure 2:
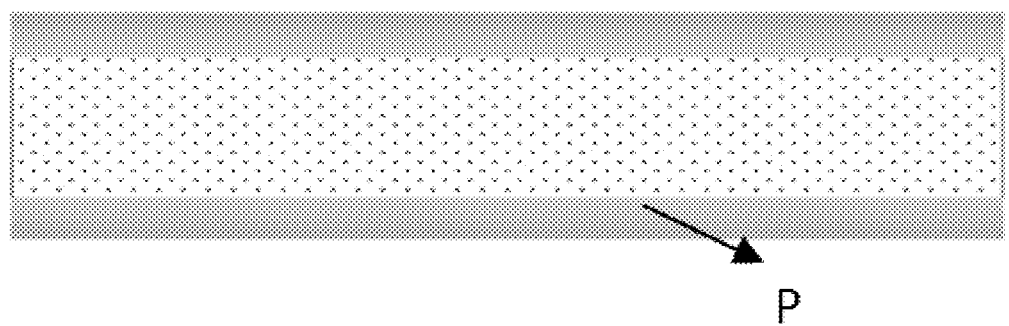
FIG. 2 is a schematic structural illustration of a silicon wafer after processing high-concentration phosphor deposition in a production process of high voltage and high current Schottky diode with diffused design according to the preferred embodiment of the present invention.

(b) Process high-concentration phosphor deposition for the raw silicon wafer 10. FIG. 2 refers to a structural illustration of the silicon wafer after processing high-concentration phosphor deposition.

Figure 3:
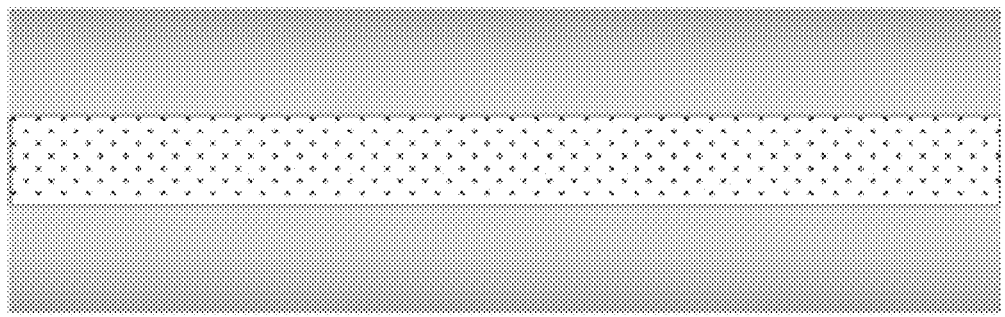
FIG. 3 is a schematic structural illustration of a silicon wafer after processing high-concentration N+ phosphorus diffusion in a production process of high voltage and high current Schottky diode with diffused design according to the preferred embodiment of the present invention.

(c) Process high-concentration N+ phosphorus diffusion. FIG. 3 refers to a structural illustration of the silicon wafer after processing high-concentration N+ phosphorus diffusion.

Figure 4:
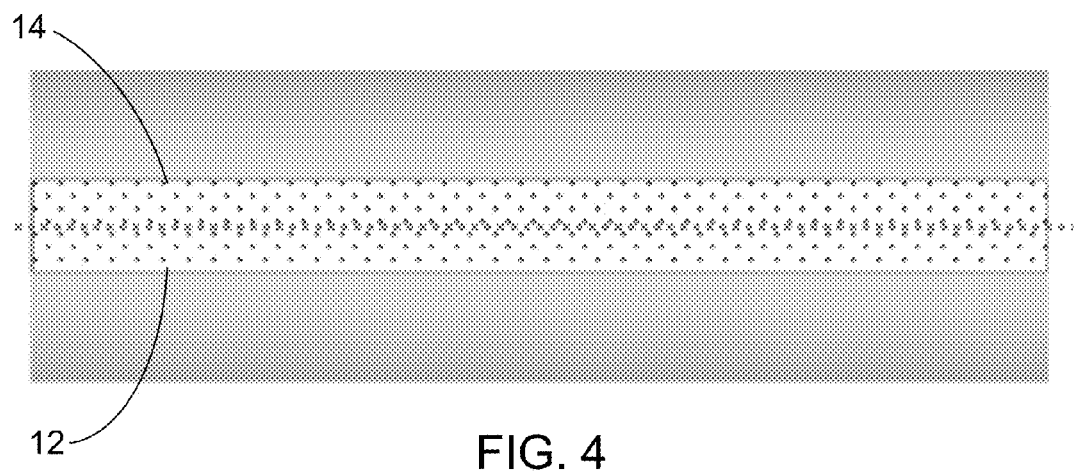
FIG. 4 is a schematic structural illustration of two silicon units after processing wire cutting in a production process of high voltage and high current Schottky diode with diffused design according to the preferred embodiment of the present invention.

(d) Process wire cutting to form two equal silicon units 12, 14. FIG. 4 refers to a structural illustration of the silicon units 12, 14 after processing wire cutting.

Figure 5:
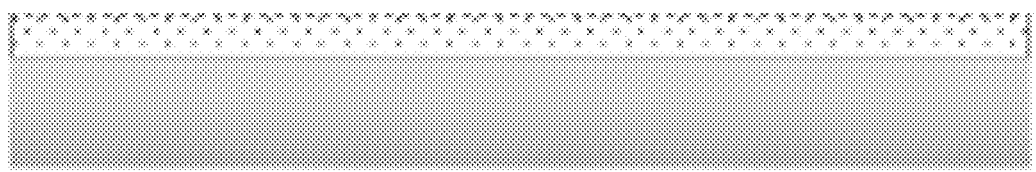
FIG. 5 is a schematic structural illustration of a silicon unit after processing chemical mechanical polishing in a production process of high voltage and high current Schottky diode with diffused design according to the preferred embodiment of the present invention.

(e) Process chemical mechanical polishing (CMP). FIG. 5 refers to a structural illustration of one of the silicon units after chemical mechanical polishing.

(f) Process classification of the polished silicon unit into one of the preset group of a preset voltage applicability based on resistivity and thickness.

Figure 6:
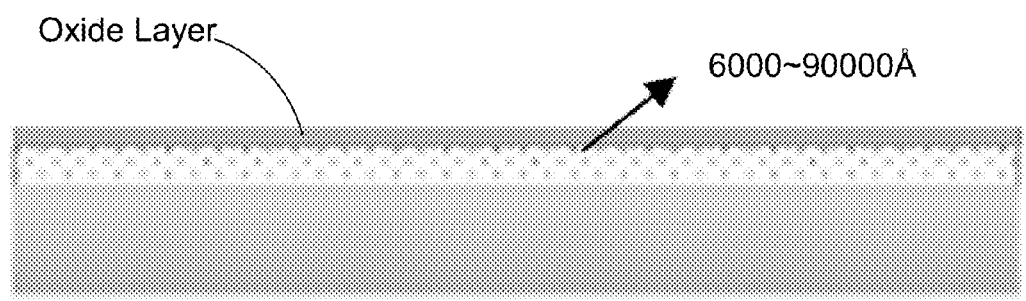
FIG. 6 is a schematic structural illustration of a silicon unit after processing primary oxidation in a production process of high voltage and high current Schottky diode with diffused design according to the preferred embodiment of the present invention.

(g) Process primary oxidation such that an oxide layer of 6000~9000 angstrom, preferably 8000 angstrom, is formed. FIG. 6 refers to a structural illustration of the silicon unit after processing primary oxidation.

Figure 7A:
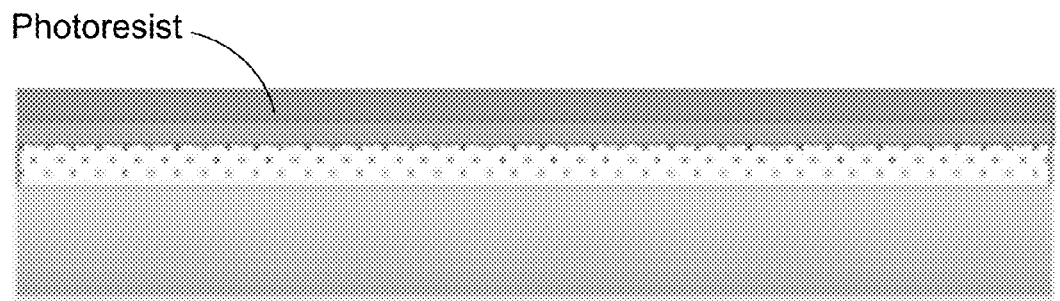
FIG. 7A is a schematic structural illustration of a silicon unit after processing photoresist coating in a primary lithographic process of a production process of high voltage and high current Schottky diode with diffused design according to the preferred embodiment of the present invention.
Figure 7B:
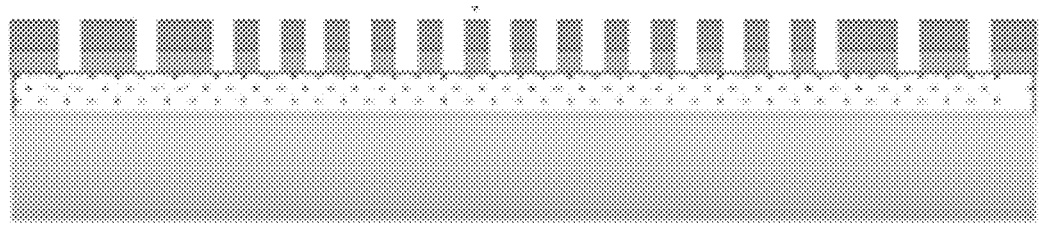
FIG. 7B is a schematic structural illustration of a silicon unit after processing lithographic etching in a primary lithographic process of a production process of high voltage and high current Schottky diode with diffused design according to the preferred embodiment of the present invention.
Figure 7C:
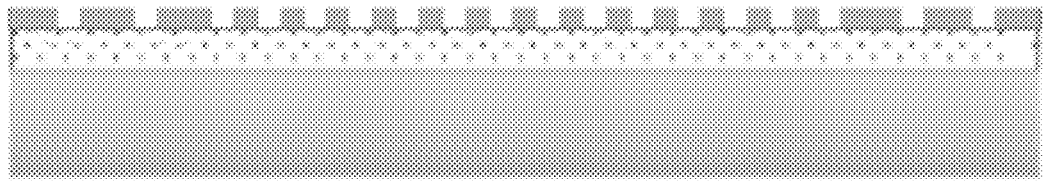
FIG. 7C is a schematic structural illustration of a silicon unit after processing plasma ashing in a primary lithographic process of a production process of high voltage and high current Schottky diode with diffused design according to the preferred embodiment of the present invention.

(h) Process primary lithographic process: the process includes photoresist coating, lithographic etching, and plasma ashing. FIG. 7A refers to a structural illustration of the silicon unit after photoresist coating. FIG. 7B refers to a structural illustration of the silicon unit after lithographic etching. FIG. 7C refers to a structural illustration of the silicon unit after plasma ashing.

Figure 8:
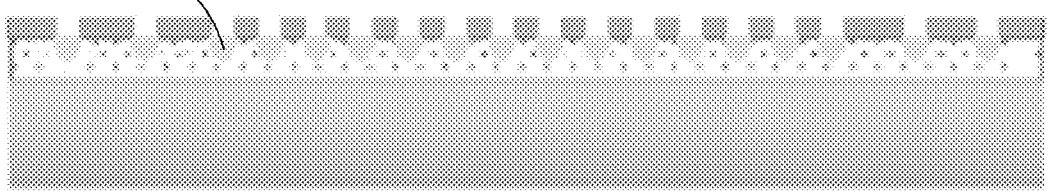
FIG. 8 is a schematic structural illustration of a silicon unit after processing boron diffusion of a production process of high voltage and high current Schottky diode with diffused design according to the preferred embodiment of the present invention.

(i) Process boron diffusion for forming a JBS structure and a voltage divider ring. FIG. 8 refers to a structural illustration of the silicon unit after processing boron diffusion.

Figure 9A:
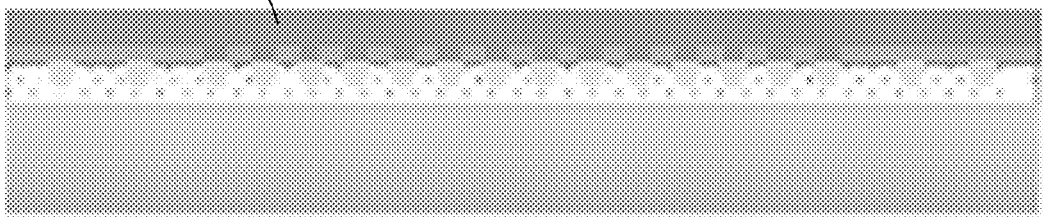
FIG. 9A is a schematic structural illustration of a silicon unit after processing photoresist coating in a secondary lithographic process of a production process of high voltage and high current Schottky diode with diffused design according to the preferred embodiment of the present invention.
Figure 9B:
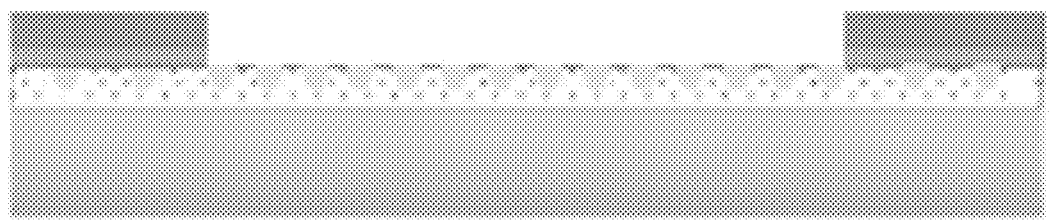
FIG. 9B is a schematic structural illustration of a silicon unit after processing lithographic etching in a secondary lithographic process of a production process of high voltage and high current Schottky diode with diffused design according to the preferred embodiment of the present invention.
Figure 9C:
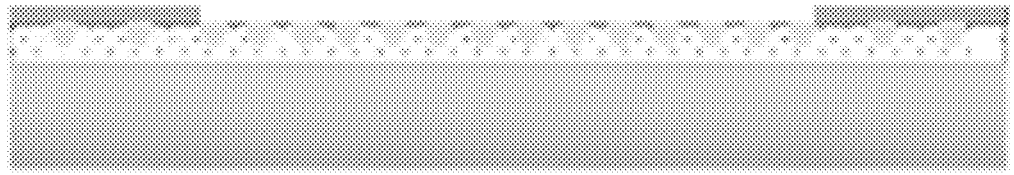
FIG. 9C is a schematic structural illustration of a silicon unit after processing plasma ashing in a secondary lithographic process of a production process of high voltage and high current Schottky diode with diffused design according to the preferred embodiment of the present invention.

(j) Process secondary lithography and leading wiring holes: the process includes photoresist coating, lithographic etching, and plasma ashing. FIG. 9A refers to a structural illustration of the silicon unit after photoresist coating. FIG. 9B refers to a structural illustration of the silicon unit after lithographic etching. FIG. 9C refers to a structural illustration of the silicon unit after plasma ashing.

Figure 9D:
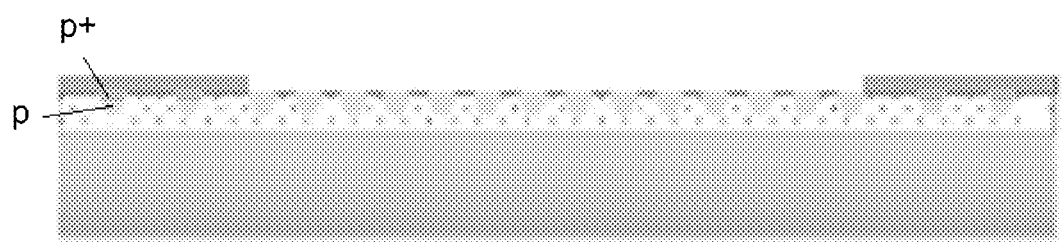
FIG. 9D is a schematic structural illustration of a silicon unit after processing ion implantation of a production process of high voltage and high current Schottky diode with diffused design according to the preferred embodiment of the present invention.

(k) Process ion implantation by injecting Boron ions to the voltage divider ring to form a p+ layer. The concentration of p+ is $4\sim5\times10^{19}$ mM. The concentration of p is $4\sim5\times10^{18}$ mM. FIG. 9D refers to a structural illustration of the silicon unit after processing ion implantation.

Figure 10:
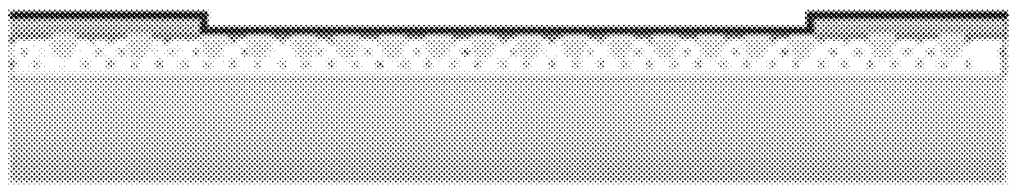
FIG. 10 is a schematic structural illustration of a silicon unit after processing metal spluttering of a production process of high voltage and high current Schottky diode with diffused design according to the preferred embodiment of the present invention.

(l) Process metal spluttering (Ni/Pt15-30% alloy or Ti) to form a primary metal layer. FIG. 10 refers to a structural illustration of the silicon unit after processing metal spluttering.

Figure 11:
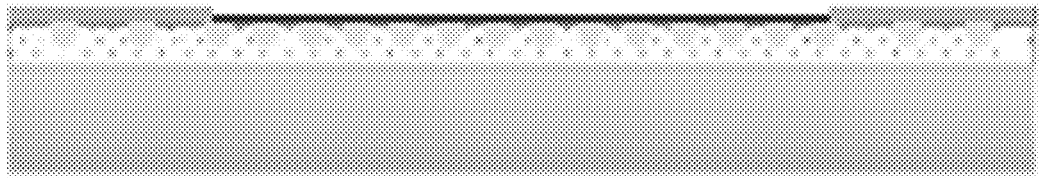
FIG. 11 is a schematic structural illustration of a silicon unit after processing etching of a production process of high voltage and high current Schottky diode with diffused design according to the preferred embodiment of the present invention.

(m) Formation of Schottky barrier through utilizing an alloy furnace with a temperature of 480-510° C. under atmospheric $N_2$+15% $H_2$ (by volume ratio). FIG. 11 is a structural illustration of the silicon unit after processing.

Figure 12A:
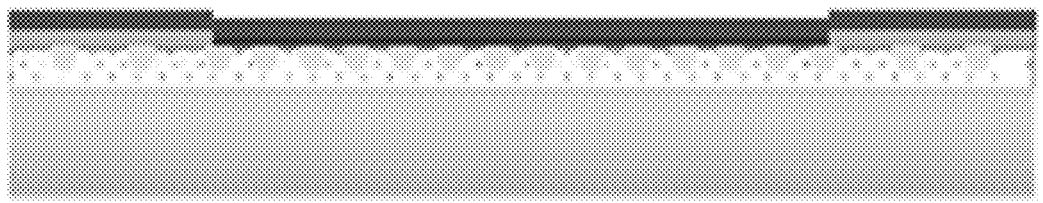
FIGS. 12A and 12B are schematic structural illustrations of a silicon unit after processing evaporating process and coating and exposure process of a production process of high voltage and high current Schottky diode with diffused design according to the preferred embodiment of the present invention.
Figure 12B:
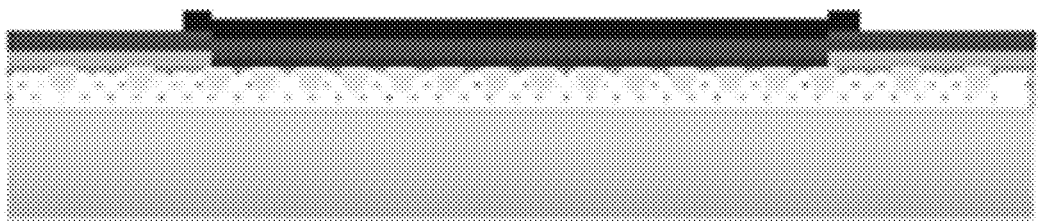

(n) Process metal evaporation for front contact side 21. In order to form the secondary metal layer, one of the two paths: (i) Titanium (Ti), Nickel (Ni) and Silver (Ag) and (ii) Titanium (Ti), Nickel (Ni) and Aluminum (Al) can be selected. According to this embodiment, first, process evaporation step with (i) Titanium (Ti), Nickel (Ni) and Silver (Ag). Second, processing coating and exposure step. FIG. 12A is a structural illustration of the silicon unit after processing evaporation step. FIG. 12B is a structural illustration of the silicon unit after processing coating and exposure step.

Figure 13:
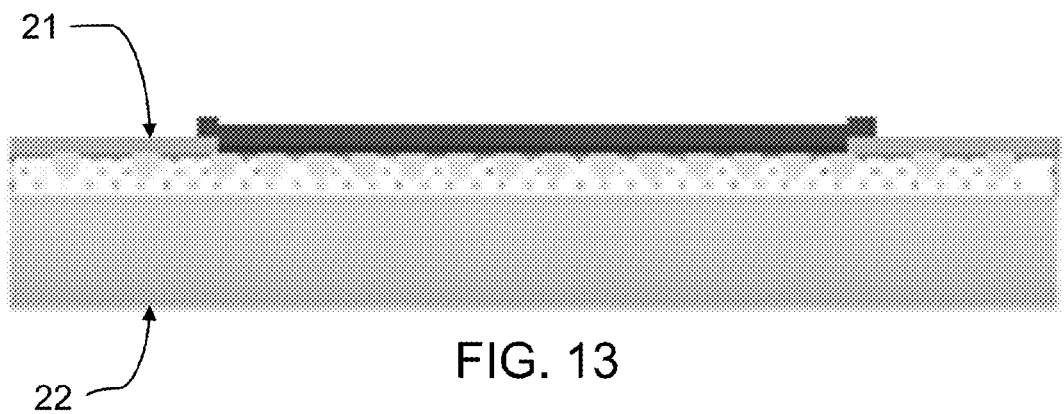
FIG. 13 is a schematic structural illustration of a silicon unit after processing metal lithography of a production process of high voltage and high current Schottky diode with diffused design according to the preferred embodiment of the present invention.

(o) Process metal lithography such that the secondary metal layer is left in a predetermined local region. FIG. 13 refers to a structural illustration of the silicon unit after processing metal lithography.

Figure 14:
FIG. 14 is a schematic structural illustration of a silicon unit after processing chemical cleaning of rear side of a production process of high voltage and high current Schottky diode with diffused design according to the preferred embodiment of the present invention.

(p) Process rear side 22 treatment: remove residual oxide layer and harmful substances by chemical method through cleaning agents. Three liquid substances are used as the cleaning agents for chemical cleaning and the cleaning agents are $HNO_3$, HF and HAC, wherein $HNO_3$:HF:HAC: $H_2O$=1:1:1:20~25 and a cleaning time is 30±5 seconds. FIG. 14 refers to a structural illustration of the silicon unit after processing rear side treatment.

(q) Process metal evaporation for rear contact side by Titanium (Ti), Nickel (Ni) and Silver (Ag) to form a rear metal layer. FIG. 15 refers to a structural illustration of a final product after processing metal evaporation for rear contact side.

Referring to FIG. 16 of the drawings, a process of manufacturing high voltage and high current Schottky diode with diffused design according to the preferred embodiment of the present invention comprises the following steps in order:

(a) selecting a raw N-type silicon wafer;

(b) processing phosphor deposition for a surface of the raw N-type silicon wafer to form a high-concentration phosphorus layer on the surface;

(c) processing high-concentration N+ phosphorus diffusion;

(d) wire cutting the silicon wafer into two equal silicon units;

(e) processing chemical mechanical polishing (CMP) for at least one of the silicon units;

(f) classifying the silicon unit into one of different preset voltage groups;

(g) processing primary oxidation;

(h) processing primary lithography;

(i) processing boron diffusion to form a p-type diffusion layer;

(j) processing secondary lithography for a wiring hole;

(k) processing ion implantation to form p+ layer;

(l) processing metal spluttering;

(m) forming Schottky barrier;

(n) processing metal evaporation for front side;

(o) processing lithography for front metal;

(p) processing etching for rear side; and (q) processing metal evaporation for rear side.

Preferably, in the step (d), a wire diameter of 30±5 μm is used for wire cutting, in the step (e), a surface of 30±5 μm is removed by chemical mechanical polishing to obtain a polished silicon unit of 205±5 μm; in the step (i), the p-type diffusion layer formed has a thickness of 6±1 μm; in the step (j), the wiring hole is in the central region of the silicon unit; in the step (k), the p+ layer has a thickness of 4~5×1019 mM; in the step (n), a combination of Titanium, Nickel and Silver or a combination of Titanium, Nickel and Aluminum is used for metal evaporation; and in the step (p), residual oxide layer or harmful substance is removed by an etching solution.

Preferably, in the step (f), the silicon unit is classified into one of the resistivity groups of 6-7.9, 8-9.9 and 10-12 and thickness groups of 200-204 and 205-210 μm.

For ρ=6-7.9: (thickness 200-204 μm) 300-350V; (thickness 205-210 μm) 351-400V.

For ρ=8-9.9: (thickness 200-204 μm) 401-450V; (thickness 205-210 μm) 451-500V.

For ρ=10-12: (thickness 200-204 μm) 501-550V; (thickness 205-210 μm) 551-600V.

Preferably, in the step (b), the process is carried out by placing the raw silicon wafer inside a diffusion furnace and providing a liquid phosphorus pentoxide which is carried by 5% oxygen gas (by volume ratio) to the silicon wafer under a temperature of 1150-50° C. under a nitrogen gas protection environment for a process time of 120±10 minutes, wherein the phosphorus pentoxide breaks down to form the high-concentration phosphor layer on a surface of the raw silicon wafer.

Preferably, in the step (b), the process is carried out by placing the raw silicon wafer inside a diffusion furnace and providing a liquid phosphorus pentoxide which is carried by 5% oxygen gas (by volume ratio) to the silicon wafer under a temperature of 1150-50° C. under a nitrogen gas protection environment for a process time of 120±10 minutes, wherein the phosphorus pentoxide breaks down to form the high-concentration phosphor layer on a surface of the raw silicon wafer.

Preferably, in the step (a), the raw silicon wafer has a resistivity p of 6-12 Ω·cm and a thickness of 500±50 μm.

Preferably, in the step (c), the process is carried out inside a diffusion furnace at a temperature of 1275±50° C. and a process time of 175±5 hours under a protective gas environment of 90% nitrogen gas and 10% oxygen gas (by volume ratio).

Preferably, in the step (g), the process of primary oxidation is carried out at a temperature of 1100-50° C. and a process time of 110±10 minutes under an atmospheric environment of N2+(H2+O2)+O2.

Preferably, in the step (l), Ni/Pt15-30% alloy or Ti is used.

Preferably, in the step (m), the process is carried out inside an Alloy furnace at a temperature of 480-510° C. under an atmospheric environment of $N_2$ and 15% $H_2$ (by volume ratio).

Preferably, the etching solution has a composition of $HNO_3$, HF, HAC and $H_2O$, where $HNO_3$:HF:HAC:$H_2O$=1:1:1:20~25.

The purpose of classification is based on the relationship between resistivity, thickness and voltage to classify the polished silicon units for different voltage range applicability. In other words, after the step (e), the silicon unit has a resistivity of 6-12, a thickness of 200-210 μm, and hence a voltage applicability of 351-600V.

According to the process of the present invention, the epitaxial process is avoided in the manufacturing process. The final product is equipped with the advantages of Schottky diode and is applicable for high voltage of 300-600V and high current of 10-100 A. The current leakage and defect rate are dramatically lowered while the cost is lowered, thus mass production is facilitated.

One skilled in the art will understand that the embodiment of the present invention as shown in the drawings and described above is exemplary only and not intended to be limiting. It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A process of manufacturing high voltage and high current Schottky diode with diffused design, comprising the sequential steps of:
   (a) selecting a raw N-type silicon wafer;
   (b) processing phosphor deposition for a surface of the raw N-type silicon wafer to form a high-concentration phosphorus layer on the surface;
   (c) processing high-concentration N+ phosphorus diffusion;
   (d) wire cutting the silicon wafer into two equal silicon units;
   (e) processing chemical mechanical polishing (CMP) for at least one of the silicon units;
   (f) classifying the silicon unit into one of different preset voltage groups;
   (g) processing primary oxidation;
   (h) processing primary lithography;
   (i) processing boron diffusion to form a p-type diffusion layer;
   (j) processing secondary lithography for a wiring hole;
   (k) processing ion implantation to form p+ layer;
   (l) processing metal sputtering;
   (m) forming Schottky barrier;
   (n) processing metal evaporation for front side;
   (o) processing lithography for front metal;
   (p) processing etching for rear side; and
   (q) processing metal evaporation for rear side.

2. The process of manufacturing high voltage and high current Schottky diode with diffused design according to claim 1 wherein in the step (d), a wire diameter of 30±5 μm is used for wire cutting, wherein in the step (e), a surface of 30±5 μm is removed by chemical mechanical polishing to obtain a polished silicon unit of 205±5 μm; in the step (i), the p-type diffusion layer formed has a thickness of 6±1 μm; in the step (j), the wiring hole is in the central region of the silicon unit; in the step (k), the p+ layer has a thickness of 4~5×10$^{19}$ mM; in the step (n), a combination of Titanium, Nickel and Silver or a combination of Titanium, Nickel and Aluminum is used for metal evaporation; and in the step (p), residual oxide layer or harmful substance is removed by an etching solution.

3. The process of manufacturing high voltage and high current Schottky diode with diffused design according to claim 1, wherein in the step (f), the silicon unit is classified into resistivity groups of 6-7.9, 8-9.9 and 10-12 and thickness groups of 200-204 and 205-210 μm.

4. The process of manufacturing high voltage and high current Schottky diode with diffused design according to claim 2, wherein in the step (f), the silicon unit is classified into resistivity groups of 6-7.9, 8-9.9 and 10-12 and thickness groups of 200-204 and 205-210 μm.

5. The process of manufacturing high voltage and high current Schottky diode with diffused design according to claim 1, wherein in the step (b), the process is carried out by placing the raw silicon wafer inside a diffusion furnace and providing a liquid phosphorus pentoxide which is carried by 5% oxygen gas (by volume ratio) to the silicon wafer under a temperature of 1150-50° C. under a nitrogen gas protection environment for a process time of 120±10 minutes, wherein the phosphorus pentoxide breaks down to form the high-concentration phosphor layer on a surface of the raw silicon wafer.

6. The process of manufacturing high voltage and high current Schottky diode with diffused design according to claim 2, wherein in the step (b), the process is carried out by placing the raw silicon wafer inside a diffusion furnace and providing a liquid phosphorus pentoxide which is carried by 5% oxygen gas (by volume ratio) to the silicon wafer under a temperature of 1150-50° C. under a nitrogen gas protection environment for a process time of 120±10 minutes, wherein the phosphorus pentoxide breaks down to form the high-concentration phosphor layer on a surface of the raw silicon wafer.

7. The process of manufacturing high voltage and high current Schottky diode with diffused design according to claim 3, wherein in the step (b), the process is carried out by placing the raw silicon wafer inside a diffusion furnace and providing a liquid phosphorus pentoxide which is carried by 5% oxygen gas (by volume ratio) to the silicon wafer under a temperature of 1150-50° C. under a nitrogen gas protection environment for a process time of 120±10 minutes, wherein the phosphorus pentoxide breaks down to form the high-concentration phosphor layer on a surface of the raw silicon wafer.

8. The process of manufacturing high voltage and high current Schottky diode with diffused design according to claim 4, wherein in the step (b), the process is carried out by placing the raw silicon wafer inside a diffusion furnace and providing a liquid phosphorus pentoxide which is carried by 5% oxygen gas (by volume ratio) to the silicon wafer under a temperature of 1150-50° C. under a nitrogen gas protection environment for a process time of 120±10 minutes, wherein the phosphorus pentoxide breaks down to form the high-concentration phosphor layer on a surface of the raw silicon wafer.

9. The process of manufacturing high voltage and high current Schottky diode with diffused design according to claim 1, wherein in the step (a), the raw silicon wafer has a resistivity p of 6-12 $\Omega \cdot cm$ and a thickness of 500±50 μm.

10. The process of manufacturing high voltage and high current Schottky diode with diffused design according to claim 8, wherein in the step (a), the raw silicon wafer has a resistivity p of 6-12 $\Omega \cdot cm$ and a thickness of 500±50 μm.

11. The process of manufacturing high voltage and high current Schottky diode with diffused design according to claim 1, wherein in the step (c), the process is carried out inside a diffusion furnace at a temperature of 1275±50° C. and a process time of 175±5 hours under a protective gas environment of 90% nitrogen gas and 10% oxygen gas (by volume ratio).

12. The process of manufacturing high voltage and high current Schottky diode with diffused design according to claim 10, wherein in the step (c), the process is carried out inside a diffusion furnace at a temperature of 1275±50° C. and a process time of 175±5 hours under a protective gas environment of 90% nitrogen gas and 10% oxygen gas (by volume ratio).

13. The process of manufacturing high voltage and high current Schottky diode with diffused design according to claim 1, wherein in the step (g), the process of primary oxidation is carried out at a temperature of 1100-50° C. and a process time of 110±10 minutes under an atmospheric environment of $N_2+(H_2+O_2)+O_2$.

14. The process of manufacturing high voltage and high current Schottky diode with diffused design according to claim 12, wherein in the step (g), the process of primary oxidation is carried out at a temperature of 1100-50° C. and a process time of 110±10 minutes under an atmospheric environment of $N_2+(H_2+O_2)+O_2$.

15. The process of manufacturing high voltage and high current Schottky diode with diffused design according to claim 1, wherein in the step (l), Ni/Pt15-30% alloy or Ti is used.

16. The process of manufacturing high voltage and high current Schottky diode with diffused design according to claim 14, wherein in the step (l), Ni/Pt15-30% alloy or Ti is used.

17. The process of manufacturing high voltage and high current Schottky diode with diffused design according to claim 1, wherein in the step (m), the process is carried out inside an Alloy furnace at a temperature of 480-510° C. under an atmospheric environment of $N_2$ and 15% $H_2$ (by volume ratio).

18. The process of manufacturing high voltage and high current Schottky diode with diffused design according to claim 16, wherein in the step (m), the process is carried out inside an Alloy furnace at a temperature of 480-510° C. under an atmospheric environment of $N_2$ and 15% $H_2$ (by volume ratio).

19. The process of manufacturing high voltage and high current Schottky diode with diffused design according to claim 2, the etching solution has a composition of $HNO_3$, HF, HAC and $H_2O$, where $HNO_3$:HF:HAC:$H_2O$=1:1:1:20~25.

20. The process of manufacturing high voltage and high current Schottky diode with diffused design according to claim 18, the etching solution has a composition of $HNO_3$, HF, HAC and $H_2O$, where $HNO_3$:HF:HAC:$H_2O$=1:1:1:20~25.

* * * * *